(12) United States Patent
Krasnov

(10) Patent No.: US 8,766,245 B2
(45) Date of Patent: *Jul. 1, 2014

(54) ORGANIC LIGHT EMITTING DIODE WITH TRANSPARENT ELECTRODE AND METHOD OF MAKING SAME

(75) Inventor: Alexey Krasnov, Canton, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/585,149

(22) Filed: Aug. 14, 2012

(65) Prior Publication Data

US 2014/0048775 A1    Feb. 20, 2014

(51) Int. Cl.
*H01L 29/04* (2006.01)

(52) U.S. Cl.
USPC ............ 257/40; 483/82; 483/99; 483/104; 483/725; 483/780

(58) Field of Classification Search
USPC ........ 438/99, 104, 82, 725, 780, 623; 257/40, 257/642, 643, 759
See application file for complete search history.

(56) References Cited

U.S. PATENT DOCUMENTS

| | | | |
|---|---|---|---|
| 6,262,441 B1 | 7/2001 | Bohler et al. | |
| 7,601,436 B2 | 10/2009 | Djurovich et al. | |
| 7,629,741 B2 | 12/2009 | Liao et al. | |
| 7,659,661 B2 | 2/2010 | Park | |
| 7,662,663 B2 | 2/2010 | Cok et al. | |
| 7,663,311 B2 | 2/2010 | Im et al. | |
| 7,663,312 B2 | 2/2010 | Anandan | |
| 8,080,141 B2 | 12/2011 | Krasnov | |
| 8,313,620 B2 | 11/2012 | Krasnov | |
| 8,518,221 B2 | 8/2013 | Krasnov | |
| 8,524,526 B1* | 9/2013 | Krasnov | 438/99 |
| 2009/0295283 A1 | 12/2009 | Kim et al. | |
| 2011/0193477 A1 | 8/2011 | Lifka et al. | |
| 2012/0001156 A1* | 1/2012 | Cho et al. | 257/40 |

FOREIGN PATENT DOCUMENTS

| | | |
|---|---|---|
| DE | 42 39 355 | 5/1994 |
| GB | 2 054 659 | 2/1981 |

OTHER PUBLICATIONS

U.S. Appl. No. 13/585,001, filed Aug. 14, 2012, Krasnov.
U.S. Appl. No. 13/064,063, filed Mar. 3, 2011; Imran et al.
U.S. Appl. No. 13/064,062, filed Mar. 3, 2011; Imran et al.
U.S. Appl. No. 13/488,779, filed Jun. 5, 2012; Veerasamy.
International Search Report mailed Sep. 16, 2013.

* cited by examiner

*Primary Examiner* — Chuong A Luu
(74) *Attorney, Agent, or Firm* — Nixon & Vanderhye P.C.

(57) ABSTRACT

A transparent electrode is provided for an organic light emitting diode (OLED) device. The electrode may be made according to a method including: sputter-depositing a first layer of or including indium tin oxide (ITO) on a substrate; sputter-depositing a thin second metallic or substantially metallic layer on the glass substrate over the first layer to form an electrode structure, and heat treating the electrode structure at temperature(s) of at least about 400 degrees C. in order to thermally activate at least the first layer of or including ITO. The electrode structure may then be provided in an OLED device on the light-emitting side of the organic light emitting semiconductor layer.

23 Claims, 3 Drawing Sheets

US 8,766,245 B2

ORGANIC LIGHT EMITTING DIODE WITH TRANSPARENT ELECTRODE AND METHOD OF MAKING SAME

Certain example embodiments relate to improved organic light emitting diode (OLED) devices, and/or methods of making the same. In particular, certain embodiments of this invention relate to a transparent electrode for an OLED device, and methods of making the same. In certain example embodiments, the electrode is made by sputter-depositing on a substrate a first transparent conductive oxide (TCO) layer (e.g., of or including ITO) and then a second conductive layer that is metallic or substantially metallic. The first TCO layer is located between the substrate and the second conductive layer. The first TCO layer is substantially more oxided than is the second layer, and the first and second layers are of different materials. The first and second conductive layers on the substrate may then be heat treated (HT) at high temperature(s) in order to thermally activate the first TCO layer and/or increase visible transmission of the electrode to be used in an OLED.

BACKGROUND AND SUMMARY OF EXAMPLE EMBODIMENTS

An organic light emitting diode (OLED) is a light-emitting diode (LED) in which the emissive electroluminescent layer(s) is a film of or based mainly on organic compounds which emit light in response to an electric current. This layer of organic semiconductor material is situated between two electrodes in some cases. Generally, for example, at least one of these electrodes is transparent. OLEDs sometimes are used in television screens; computer monitors; small or portable system screens such as those found on mobile phones and PDAs; and/or the like. OLEDs may also sometimes be used in light sources for space illumination and in large-area light-emitting elements. OLED devices are described, for example, U.S. Pat. Nos. 7,663,311; 7,663,312; 7,662,663; 7,659,661; 7,629,741; 7,601,436, 2011/0193477, and 2009/0295283, the entire contents of all of which are hereby incorporated herein by reference.

A typical OLED comprises at least two organic layers—e.g., electron and hole transport layers—that are embedded between two electrodes. One electrode typically is made of a reflective metal. The other electrode typically is a transparent conductive layer supported by a glass substrate. The one electrode generally is the cathode, and the other electrode generally is the anode. Indium tin oxide (ITO), which is typically transparent, often is used at the front portion of the OLED as the anode.

FIG. 1 is an example cross-sectional view of a typical OLED. The OLED includes glass substrate 102, transparent conductive anode layer 104, organic layer 100, cathode layer 110 and cover glass 112. The organic light emission layer 100 emits light, and light is generated by processes known from conventional OLEDs when electrons and holes injected into the organic layer 100 from different sides recombine. The organic layer 100 may include multiple layers. For example, in certain example instances the organic layer 100 may include a hole injection layer, a hole transport layer, a light-emitting layer, an electron transport layer, and an electron injection layer. An example shown in FIG. 1 illustrates the organic semiconductor layer 100 including a hole transport layer (HTL), and electron transport layer (ETL), and an emitting layer (EL), where the ETL and emitting layer may or may not be present in one layer.

When a voltage is applied to the electrodes 104 and 110, the charges start moving in the device under the influence of the electric field. Electrons leave the cathode, and holes move from the anode in opposite direction. For example, the recombination of these charges leads to the creation of photons with frequencies given by an energy gap between LUMO and HOMO levels of the emitting molecules, so that the electrical power applied to the electrodes is transformed into light. Different materials and/or dopants may be used to generate different colors, with the colors being combinable to achieve yet additional colors.

This disclosure relates to a design and method of making a transparent conductive electrode (e.g., anode) on the light-emitting side of the organic layer of an OLED. For example, referring to the OLED in FIG. 1, this disclosure relates to an improved electrode 104 on the light emitting side of the organic layer 100 and a method of making the same. The electrode may be based on ITO. A second thin metallic or substantially metallic layer may be deposited on top of the first layer of or including ITO. The first and second layers are deposited (directly or indirectly) on the substrate, and may be deposited for example via sputtering at approximately room temperature. The thin metallic or substantially metallic layer may be of a single metal (e.g., Ni, Pt, or Au), a mixture of Ni, Pt, and/or Au, or may be a metallic or substantially metallic alloy (e.g., NiCrMo, NiCrAlFe, NiTi, NiMo, or mixtures thereof). After the thin layer is deposited over the TCO, the substrate (e.g., glass or quartz substrate) with the TCO layer and the thin layer thereon is subject to heat treatment (HT) in order to (a) thermally activate at least the TCO layer for desired electrical and/or optical properties, (b) increase the work function (WF) of the electrode, and/or (c) increase visible transmission of the electrode. The thin film over the TCO is advantageous in that it (i) serves as an oxygen blocking layer during subsequent thermal activation of the ITO to reduce undesired excessive oxidation of the ITO during its thermal activation, and/or (ii) controls the Fermi level of the transparent electrode to minimize or reduce the electrical barrier with the Highest-Occupied-Molecular Orbital (HOMO) of the Hole Transport Layer (HTL) of the OLED.

The first TCO layer (e.g., of or including ITO) is substantially more oxided as deposited than is the second layer which is a thin metallic or substantially metallic layer. The thin metallic or substantially metallic layer may be either non-oxided or slightly oxided in different embodiments. In certain example embodiments, as deposited, the first TCO layer contains at least about 15% more oxygen, more preferably at least about 20% more oxygen, even more preferably at least about 30% more oxygen, and most preferable at least about 40% more oxygen, than does the subsequently deposited thin metallic or substantially metallic layer.

In certain example embodiments of this invention, there is provided method of making an organic light emitting diode (OLED) device, the method comprising: sputter-depositing a first layer comprising indium tin oxide (ITO) on a glass substrate; sputter-depositing a second metallic or substantially metallic layer on the glass substrate over and directly contacting the first layer comprising ITO to form an electrode structure, so that the first layer comprising ITO is located between at least the substrate and the second metallic or substantially metallic layer; heat treating the electrode structure including the substrate, the first layer comprising ITO, and the second metallic or substantially metallic layer, at temperature(s) of at least about 300 degrees C. in order to thermally activate the first layer comprising ITO; and providing the electrode structure in an OLED device so that an organic light emitting semiconductor layer is located between said electrode structure and another electrode. The sputter-depositing of the first and second layers may be performed at approximately room temperature.

In certain example embodiments of this invention, there is provided an OLED comprising: a transparent conductive electrode structure comprising a first layer comprising ITO and a second conductive layer on a substrate, the first layer comprising ITO being located between at least the substrate and the conductive layer; wherein the second conductive layer comprises one or more of Ni, Pt, Au, NiCrMo, NiCrAlFe, NiTi, NiCr, and NiMo; an organic light emitting layer located between said transparent conductive electrode structure and another electrode, and wherein said transparent conductive electrode structure is on a light emitting side of the organic light emitting layer.

In certain embodiments of this invention, there is provided an organic light emitting diode (OLED) comprising: a transparent conductive electrode structure comprising a first layer comprising indium tin oxide (ITO) and a second conductive layer on a substrate, the first layer comprising ITO being located between at least the substrate and the conductive layer; the first layer comprising ITO is thicker than the second metallic or substantially metallic layer, and the second metallic or substantially metallic layer has a work function of at least 4.5, more preferably of at least 4.6, and even more preferably of at least 4.7; and an organic light emitting layer located between said transparent conductive electrode structure and another electrode, and wherein said transparent conductive electrode structure is on a light emitting side of the organic light emitting layer.

These and other embodiments, features, aspect, and advantages may be combined in any suitable combination or subcombination to produce yet further embodiments.

BRIEF DESCRIPTION OF THE DRAWINGS

These and other features and advantages may be better and more completely understood by reference to the following detailed description of exemplary illustrative embodiments in conjunction with the drawings, in which like reference numerals indicate like parts throughout the several views, of which.

DETAILED DESCRIPTION OF CERTAIN EXAMPLE EMBODIMENTS

Figure 1:
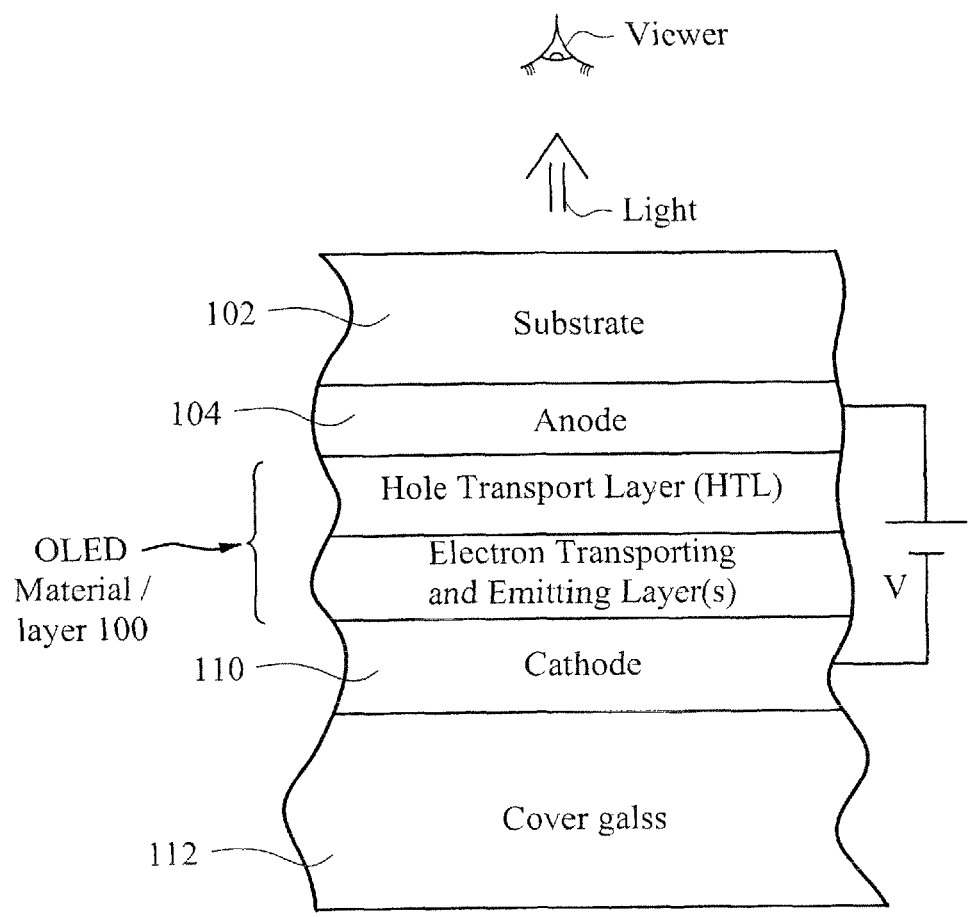
FIG. 1 is an example cross-sectional view of an OLED.

This disclosure relates to a design and method of making a transparent conductive electrode (e.g., anode) on the light-emitting side of the organic layer 100 of an OLED. The electrode may be based on ITO.

It is desirable for a light-emitting side electrode (e.g., anode) of an OLED to be highly conductive, have high optical transmission in the visible, and provide a low potential barrier for an effective hole injection into the HTL of the organic film/layer 100. It is desirable for the electrode to have a small energy difference between its Fermi level and the HOMO of the HTL. It is also desirable for the electrode to be chemically stable so as to not significantly interact in an adverse manner with the HTL of the organic film/layer 100.

The injection levels of holes into the HTL and then into the emissive layer of the organic film/layer 100 are desired to be comparable with injection levels of electrodes from the cathode 110. High-temperature deposited ITO has traditionally been used for anodes in OLEDs, and ITO has a sufficiently high Fermi level (or work function in its degenerated state). The balance in the carrier injection levels, however, may shift toward a more efficient electron injection due to (a) measures which are sometimes used to minimize the potential barrier between the cathode 110 and the ETL (and possibly the emitting layer, EL), such as for example incorporation of a thin LiF layer between an alloyed Al cathode 110 and tris(8-hydroxyquinoline)aluminum (Alq3) HTL/EL, etc., and (b) use of a non-optimized ITO for the anode such as ITO deposited at room temperature and not subsequently thermally activated. In such a case, the energy distance between the Fermi level of the ITO and its vacuum level may be insufficient which can lead to formation of a significant energy barrier between the ITO anode and the HOMO level of the HTL. Note that materials identified in the organic layer 100 are simply for purposes of example (e.g., Alq3 for the ETL/EL; and NPB for the HTL).

But room-temperature sputter-deposition of ITO is desirable in large-area sputter deposition scenarios because: less equipment is needed since there is no need to heat the substrate prior to and/or during deposition so as to reduce costs, sputtering rates are typically higher if the substrate (e.g., glass substrate) is not heated, and the process is often cleaner during room temperature deposition because out-gassing and other contamination effects can be suppressed. Accordingly, sputter deposition without intentional heating of the substrate offers certain cost advantages due, primarily, to the lower capital, lower maintenance and higher deposition rates.

However, when the ITO is deposited (e.g., sputter-deposited) at room temperature, post-deposition thermal activation of the ITO is often desired to optimize its opto-electrical properties. Higher temperatures of post-deposition heating allow better ITO properties. At about 350-500 C., however, typical ITO abruptly loses its conductivity when heated in air. A problem with post-deposition activation of the ITO is that its optimal crystallization temperature (about 550 degrees C.) is much higher than the temperature causing a drop in conductivity due to over-oxidation (about 370 degrees C.). Attempts to address this solely by providing a protective dielectric layer over the ITO have been found to be insufficient because of the desire for conductive properties of the electrode in the direction normal to the surface.

Certain example embodiments of this invention relate to a superstrate transparent ITO based electrode (e.g., anode) for OLEDs, which uses at least one layer 10 of approximately room temperature deposited ITO optimized in such a way as to provide optimal electrical and optical properties after post-deposition thermal activation. The ITO layer 10 is capped by a thin metal or metal alloy layer 20, which protects the ITO layer 10 from over-oxidation during HT and optimizes the ITO Fermi level (or work function in the degenerated state) to minimize/reduce the potential barrier for the free holes for a better matching, or substantial matching, to the HTL of the OLED. The ITO layer 10 (10') can be a single layer of or including ITO, a combination of layers of or including ITO with different oxidation states, or a combination of an ITO layer with another layer(s) of TCO material such as zinc oxide and/or indium zinc oxide.

Material(s) for the thin metallic or substantially metallic layer 20 may be chosen based on one or more of the following: (a) chemically and mechanically stable, (b) minimum interaction with the HTL, (c) having high work function (WF)

for minimizing/reducing the potential barrier between the ITO and the HOMO of the HTL, and (d) having a small optical absorption in the visible upon the post-deposition HT/baking. Examples include the following single metals and their alloys: Ni (WF=5.01 eV), Pt (WF=6.4 eV), Au (WF=5.3 eV), NiCrMo (e.g., WF of about 4.7 eV with an approximate weight ratio Ni/Cr/Mo of 56/22/13 or 65/16/16), and NiCr (WF=4.6 eV). Other possible allows for layer 20 include NiCrAlFe, NiTi, and NiMo. Example NiCrMo inclusive alloys that may be used for metallic or substantially metallic layer 20 are described in U.S. Ser. No. 13/064,062, filed Mar. 3, 2011, the disclosure of which is hereby incorporated herein by reference. Such example NiCrMo alloys for layer 20 (20') include NiCrMo alloys known as C22, BC1, B3, C4, C276 and C2000. The combination of the ITO 10 (10') with a thin metal or metal alloy layer 20 (20') determines the Fermi level (or WF) of the entire electrode. In certain embodiments of this invention, the metallic or substantially metallic layer 20 (and/or 20') has a work function of at least 4.5, more preferably of at least 4.6 or 4.7.

Metallic NiCrMo-based alloys (e.g. C22, etc.) for use as layer 20 (20') are desired in certain example embodiments. Table 1 below show the composition of an example metallic NiCrMo alloy known as C22 that may be used for layer 20 (20') for example. It will be appreciated that the NiCrMo based alloy for layer 20 (20') includes more Ni than Cr, more Ni than Mo, and may include more Cr than Mo. Small amounts of other elements may also be present as set forth in Table 1 below.

TABLE 1

Example Embodiment of $Ni_xCr_yMo_z$ (e.g., C22) - elemental composition by wt. %

| Element | Preferred | More Preferred | Example |
|---|---|---|---|
| Ni | 40-70% | 50-60% | 54-58% (e.g., 56%) |
| Cr | 5-40% | 10-30% | 20-22.5% |
| Mo | 5-30% | 10-20% | 12.5-14.5% |
| Fe | 0-15% | 0-10% | 1-5% (e.g., 3%) |
| W | 0-15% | 0-10% | 1-5% (e.g., 3%) |
| Co | 0-15% | 0-10% | 1-5% (e.g., 3%) |
| Si | 0-2% | 0-1% | =<0.2% (e.g., .08%) |
| Mn | 0-3% | 0-2% | =<1% (e.g., 0.5%) |
| C | 0-1% | 0-0.5% | =<0.1% (e.g., .01%) |
| V | 0-2% | 0-1% | =<1% (e.g., 0.35%) |

Figure 2:
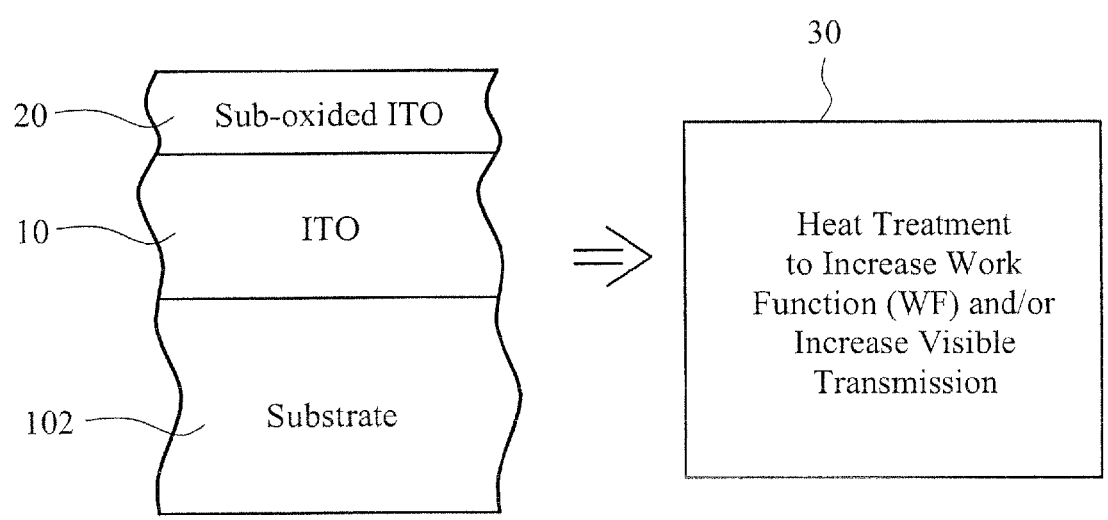
FIG. 2 is a schematic diagram of a technique for making a transparent electrode for an OLED according to an example embodiment of this invention.
Figure 3:
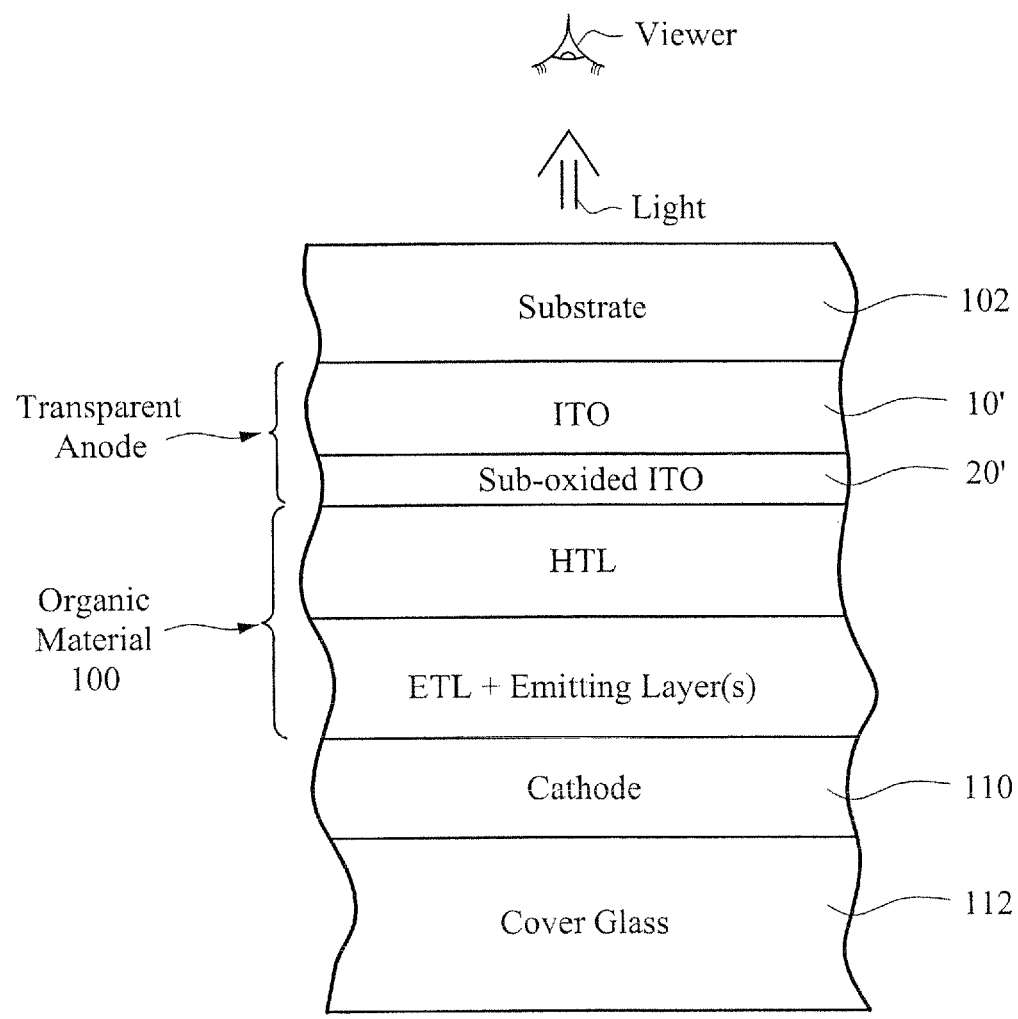
FIG. 3 is a cross-sectional view of an OLED, including the transparent electrode of FIG. 2, according to an, example embodiment of this invention.

As shown in FIG. 2, after deposition of a first layer 10 of or including ITO, a high work function (WF) thin metallic or substantially metallic layer 20 is deposited on the substrate 102 over (e.g., optionally directly contacting) the first layer. The first and second layers (10 and 20) are deposited (directly or indirectly) on the substrate, and may be deposited for example via sputtering at approximately room temperature (or possibly at an elevated temperature in certain embodiments). The thin metallic or substantially metallic layer 20 may be of a single high work function metal (e.g., Ni, Pt, or Au), a mixture of Ni, Pt, and/or Au, or may be a high work function metallic or substantially metallic alloy (e.g., NiCrMo, NiCrAlFe, NiTi, NiMo, or mixtures thereof). After the thin layer 20 is deposited over the TCO 10, the substrate (e.g., glass or quartz substrate) 102 with the TCO layer 10 and the thin layer 20 thereon is subject to heat treatment (HT) 30 in order to (a) thermally activate at least the TCO layer 10 for desired electrical and/or optical properties, (b) increase the work function (WF) of the electrode (10 and/or 20), and/or (c) increase visible transmission of the electrode (10 and/or 20). After the heat treatment 30, the electrode structure is provided in an OLED device so that an organic light emitting semiconductor layer (included in film/layer 100) is located between said electrode structure 10', 20', 102 and another electrode 110 as shown in FIG. 3. The thin film 20 over the TCO 10 is advantageous in that the thin metallic or substantially metallic film 20 (i) serves as an oxygen blocking layer during subsequent thermal activation of the ITO 10 to reduce undesired excessive oxidation of the ITO layer 10 during its thermal activation, and/or (ii) controls the Fermi level of the transparent electrode to minimize or reduce the electrical barrier with the Highest-Occupied-Molecular Orbital (HOMO) of the Hole Transport Layer (HTL) of the OLED.

The first TCO layer (e.g., of or including ITO) 10 is substantially more oxided as deposited than is the second layer 20 which is a thin metallic or substantially metallic layer. The thin metallic or substantially metallic layer 20 may be either non-oxided or slightly oxided in different embodiments. In certain example embodiments, as deposited, the first TCO layer 10 contains at least about 15% more oxygen, more preferably at least about 20% more oxygen, even more preferably at least about 30% more oxygen, and most preferable at least about 40% more oxygen, than does the subsequently deposited thin metallic or substantially metallic layer 20. Again, the thin metallic or substantially metallic layer 20 as deposited may contain little or no oxygen, and little or no nitrogen.

Thus, a transparent superstrate electrode 10, 20 (or 10', 20'), such as an anode, for OLED devices includes at least two layers, namely an ITO based layer 10 (10' after HT) and a thin metal inclusive layer 20 (20' after HT) originally deposited on substrate 102. The stoichiometry of the ITO layer 10 as deposited is optimized to ensure optimal/desired ITO electrical and optical characteristics upon HT (e.g., baking). The capping metal or metal alloy layer 20 serves as an oxygen blocking layer during subsequent thermal activation of the ITO 10 to reduce undesired excessive oxidation of the ITO layer 10 during its thermal activation, so as to prevent or reduce degradation of the opto-electrical properties of the ITO. The high WF metal or metal alloy layer 20 also has been found to significantly reduce the potential barrier between the ITO 10, 10' and the HOMO of the HTL in the OLED, compared to if the layer 20 was not present between the ITO and the HTL.

While heat treatment (HT) of the layers 10 and 20 is desirable in preferred embodiments of this invention at least in order to activate the ITO to desired level(s), this invention is not so limited and it is possible to omit heat treatment of the layers 10, 20 in certain alternative embodiments of this invention. In non-HT embodiments, the high WF metallic or substantially metallic layer 20 (20') in an OLED will still minimize or reduce the potential barrier between the ITO 10 (10') and the HOMO of the HTL in the OLED, and be advantageous in this respect.

Optionally, bus bars (not shown) may also be provided on the substrate 102 so as to electrically contact the transparent electrode in certain example embodiments. For example, either before or after the heat treating 30, a conductive film of one or more layers may be deposited on the substrate 102 over electrode layers 10 (or 10') and 20 (or 20'). The conductive film may be etched after the thermal activation 30, into a pattern defining the bus bars over layer 20'. For purposes of example, the conductive bus bar film (not shown) may be of a multilayer film of Cr/Al/Cr in certain example embodiments. The bus bars are not shown in the drawings for purposes of simplicity.

Referring to FIGS. 2-3, there is provided a method of making an electrode for use in an organic light emitting diode (OLED) device. A first layer 10 of or including ITO is sputter deposited on a substrate (e.g., of or including glass or quartz) 102, and then there is performed sputter-depositing of a second metallic or substantially metallic layer 20 on the substrate 102 over and directly contacting the first layer 10 of ITO to form an electrode structure (see FIG. 2). Sputter-depositing of the ITO layer 10 and sputter-depositing of the metallic or substantially metallic layer 20 may each comprise sputter-depositing at approximately room temperature. As sputter-deposited the first layer of or including ITO 10 is substantially more oxidized than is the second metallic or substantially metallic layer 20 (layer 20 may or may not be slightly oxided). As sputter-deposited, the second metallic or substantially metallic layer 20 may contain little or no oxygen and little or no nitrogen. Then, the structure including substrate 102 and layers 10, 20 is heat treated 30 at temperature(s) of at least about 300 degrees C. in order to thermally activate at least the ITO layer 10. The heat treating (HT) 30 may comprise heat treating the structure 102, 10, 20 at temperature(s) of at least about 400 degrees C., more preferably of at least about 500 degrees C., more preferably of at least about 550 degrees C. in certain example embodiments. The heat treatment may be, for example, at about 550 degrees C. for a period of from about 0.5 to 30 minutes (e.g., about two minutes).

As sputter-deposited and prior to HT 30, the first layer 10 of or including ITO may contain at least 15% more (more preferably at least 20% more, even more preferably at least 30% more, and still more preferably at least 40% more (mol %)) oxygen than the second metallic or substantially metallic layer 20. In certain example embodiments, the ITO layer 10 (or 10') may be thicker than the metallic or substantially metallic layer 20 (or 20'), and the metallic or substantially metallic layer 20 (or 20') has a work function (WF) of at least 4.5 (more preferably at least 4.6, and even more preferably at least 4.7) in certain example embodiments. In certain example embodiments, the ITO layer 10 (10') may be at least 50 nm thicker (more preferably at least 100 nm thicker) than the metallic or substantially metallic layer 20 (20').

In certain example embodiments, sputter-depositing of the ITO layer 10 may be performed by sputtering at least one ceramic target of indium, tin and oxygen (e.g., In/Sn ratio in the target and resulting layer of from 80/20 to 95/5, so that there is more In present than Sn), or alternatively the ITO layer 10 may be sputter deposited using at least one metal target of InSn in an atmosphere including both argon and oxygen gas (e.g., same In/Sn ratios in the target and layer as identified above for the ceramic target sputtering). Sputter-depositing of the metallic or substantially metallic layer 20 may be performed by sputtering a metal target (e.g., an Ni target, a Pt target, an Au target, or an NiCrMo target) in an atmosphere including argon gas and either entirely or mostly devoid of oxygen gas.

The ITO layer 10 may be from about 100-200 nm thick (e.g., about 150 nm thick), and the metallic or substantially metallic layer 20 may be from about 0.5 to 50 nm thick, more preferably from about 1 to 20 nm thick (e.g., about 10 nm thick).

After heat treating 30, the electrode structure 102, 10', 20' may have a visible transmission of at least about 75%, more preferably of at least about 80%, more preferably of at least about 82%, and most preferably of at least about 84%. Moreover, after the heat treating 30, the heat treated electrode (e.g., layer 10' and/or layer 20') may have a specific resistivity of less than or equal to about 0.30 mOhms-cm, more preferably less than or equal to about 0.27 mOhms-cm, and/or a Fermi level in excess of 3.2 eV.

While the substrate 102 may be of or including glass in preferred embodiments, it is also possible that the substrate may be of a different transparent material such as quartz in alternative embodiments.

After the heat treating/thermal activation 30, the electrode structure described above (e.g., including the heat treated layers 10' and 20', and optionally the substrate 102) is provided in an OLED device as shown in FIG. 3 so that an organic semiconductor film/layer 100, including an organic light emitting semiconductor layer, is located between the electrode structure and another electrode such as cathode 110. For example, after the heat treating, the organic layer/film 100 and cathode may be deposited on the substrate over the electrode structure. At least one layer in the organic film/layer 100 emits light, and light is generated when electrons and holes injected into the organic film/layer 100 from different sides recombine. The organic film/layer 100 may include multiple layers, but always includes at least one light emitting layer. For example, in certain example embodiments, organic film/layer 100 may include a hole injection layer, a hole transport layer, a light-emitting layer, an electron transport layer, and an electron injection layer. An example shown in FIG. 3 illustrates the organic semiconductor film/layer 100 including a hole transport layer (HTL), and electron transport layer (ETL), and an emitting layer, where the ETL and emitting layer may or may not be present in one layer. When a voltage is applied to the electrodes 10', 20' and 110, the charges start moving in the device under the influence of the electric field. Electrons leave the cathode 110, and holes move from the anode 10', 20' in the opposite direction, so that the electrical power applied to the electrodes is transformed into light. FIG. 3 illustrate that the electrode 110 is a cathode, and the transparent electrode including the ITO 10' is the anode, however the "cathode" and "anode" may be reversed in certain example embodiments so that the cathode may be transparent and include layers 10' and 20'.

In certain example embodiments, in one or more steps not shown, CRI matching layers, antireflective (AR) coatings, and/or the like may be provided in the OLED device in order to increase optical transmission in the visible. For example, an AR layer(s) may be provided either between the layer 10 (or 10') and substrate 102, or on the major surface of substrate opposite the layers 10', 20'. In certain example embodiments, a layer of or including silicon nitride and/or silicon oxide may be provided between the substrate 102 and the ITO layer 10 (or 10').

These techniques similarly may be used in inorganic light emitting diodes (ILEDs), polymer light emitting diode (PLEDs), and/or other diode applications.

As used herein, the terms "on," "supported by," and the like should not be interpreted to mean that two elements are directly adjacent to one another unless explicitly stated. In other words, a first layer may be said to be "on" or "supported by" a second layer, even if there are one or more layers therebetween.

In certain embodiments of this invention, there is provided a method of making an electrode for use in an organic light emitting diode (OLED) device, the method comprising: sputter-depositing a first layer comprising indium tin oxide (ITO) on a substrate; sputter-depositing a second metallic or substantially metallic layer on the substrate over and directly contacting the first layer comprising ITO to form an electrode structure, so that the first layer comprising ITO is located between at least the substrate and the second metallic or substantially metallic layer, wherein as sputter-deposited the first layer comprising ITO is substantially more oxided than is the second metallic or substantially metallic layer; and heat treating the electrode structure including the substrate, the first layer comprising ITO, and the second metallic or substantially metallic layer, at temperature(s) of at least about 300 degrees C. in order to thermally activate the first layer comprising ITO.

In the method of the immediately preceding paragraph, the first layer may consist essentially of ITO.

In the method of any of the preceding two paragraphs, as sputter-deposited, the second metallic or substantially metallic layer may contain little or no oxygen.

In the method of any of the preceding three paragraphs, the substrate may be of or comprises glass.

In the method of any of the preceding four paragraphs, as sputter-deposited, the first layer comprising ITO may contain at least 15% more (more preferably at least 20% more, even more preferably at least 30% more, and still more preferably at least 40% more (mol %)) oxygen than the second metallic or substantially metallic layer.

In the method of any of the preceding five paragraphs, the first layer comprising ITO may be thicker than the second metallic or substantially metallic layer, and the second metallic or substantially metallic layer has a work function of at least 4.5 (more preferably at least 4.6, and even more preferably at least 4.7).

In the method of any of the preceding six paragraphs, the first layer comprising ITO may be at least 50 nm thicker (more preferably at least 100 nm thicker) than the second metallic or substantially metallic layer.

In the method of any of the preceding seven paragraphs, said heat treating may comprise heat treating the electrode structure including the substrate, the first layer comprising ITO, and the second metallic or substantially metallic layer, at temperature(s) of at least about 400 degrees C., more preferably of at least about 500 degrees C., more preferably of at least about 550 degrees C. The heat treatment may be, for example, at about 550 degrees C. for a period of from about 0.5 to 30 minutes (e.g., about two minutes).

In the method of any of the preceding eight paragraphs, said sputter-depositing of the first layer comprising ITO and/or said sputter-depositing of the second metallic or substantially metallic layer may each comprise sputter-depositing at approximately room temperature.

In the method of any of the preceding nine paragraphs, said first layer comprising ITO may be sputter-deposited on the substrate so as to directly contact the substrate.

In the method of any of the preceding ten paragraphs, said sputter-depositing of the first layer comprising ITO may comprise sputtering a ceramic target comprising indium, tin and oxygen; and said sputter-depositing of the second metallic or substantially metallic layer may comprise sputtering a metal target.

In the method of any of the preceding eleven paragraphs, the first layer comprising ITO may be from about 100-200 nm thick (e.g., about 150 nm thick).

In the method of any of the preceding twelve paragraphs, the second metallic or substantially metallic layer may be from about 0.5 to 50 nm thick, more preferably from about 1 to 20 nm thick (e.g., about 10 nm thick).

In the method of any of the preceding thirteen paragraphs, after said heat treating the electrode structure may have a visible transmission of at least about 80%, more preferably of at least about 82%, and most preferably at least about 84%.

In the method of any of the preceding fourteen paragraphs, after said heat treating, the method may include providing the electrode structure in an OLED device so that an organic light emitting semiconductor layer is located between said electrode structure and another electrode.

In the method of any of the preceding fifteen paragraphs, the second metallic or substantially metallic layer may comprise or consist essentially of one or more of Ni, Pt, and Au.

In the method of any of the preceding sixteen paragraphs, the second metallic or substantially metallic layer may comprise or consist essentially of one or more of NiCrMo, NiCrAlFe, NiTi, NiCr, and NiMo.

In the method of any of the preceding seventeen paragraphs, the second metallic or substantially metallic layer may comprise or consist essentially of NiCrMo as deposited and/or after HT.

In certain embodiments of this invention, there is provided an organic light emitting diode (OLED) comprising: a transparent conductive electrode structure comprising a first layer comprising indium tin oxide (ITO) and a second conductive layer on a substrate, the first layer comprising ITO being located between at least the substrate and the conductive layer; wherein the second conductive layer comprises one or more of Ni, Pt, Au, NiCrMo, NiCrAlFe, NiTi, NiCr, and NiMo; an organic light emitting layer located between said transparent conductive electrode structure and another electrode, and wherein said transparent conductive electrode structure is on a light emitting side of the organic light emitting layer.

In certain embodiments of this invention, there is provided an organic light emitting diode (OLED) comprising: a transparent conductive electrode structure comprising a first layer comprising indium tin oxide (ITO) and a second conductive layer on a substrate, the first layer comprising ITO being located between at least the substrate and the conductive layer; the first layer comprising ITO is thicker than the second metallic or substantially metallic layer, and the second metallic or substantially metallic layer has a work function of at least 4.5, more preferably of at least 4.6, and even more preferably of at least 4.7; and an organic light emitting layer located between said transparent conductive electrode structure and another electrode, and wherein said transparent conductive electrode structure is on a light emitting side of the organic light emitting layer.

In the OLED of any of the preceding two paragraphs, the substrate may be a glass substrate.

In the OLED of any of the preceding three paragraphs, the first layer comprising ITO may contain at least 15% more (more preferably at least 20% more) oxygen than does the second conductive layer.

In the OLED of any of the preceding four paragraphs, the first layer comprising ITO may be at least 50 nm thicker (more preferably at least 100 nm thicker) than the second conductive layer.

In the OLED of any of the preceding five paragraphs, the second conductive layer may be metallic or substantially metallic.

In the OLED of any of the preceding six paragraphs, the first layer comprising ITO may be from about 100-200 nm thick (e.g., about 150 nm thick).

In the OLED of any of the preceding seven paragraphs, the second conductive layer may be from about 0.5 to 50 nm thick, more preferably from about 1 to 20 nm thick (e.g., about 10 nm thick).

In the OLED of any of the preceding eight paragraphs, the electrode structure comprising the first layer comprising ITO, the second conductive layer, and the substrate, may have a visible transmission of at least about 80%, more preferably of at least about 82%, and most preferably at least about 84%.

In the OLED of any of the preceding nine paragraphs, the second conductive layer may comprise or consist essentially of one or more of NiCrMo, NiCrAlFe, NiTi, and NiMo.

In the OLED of any of the preceding ten paragraphs, the second conductive layer may comprise or consist essentially of NiCrMo which may or may not be oxidized.

In the OLED of any of the preceding eleven paragraphs, the second conductive layer may comprise or consist essentially of one or more of Ni, Pt, Au, NiCr, and NiCrMo.

In the OLED of any of the preceding twelve paragraphs, the metal of the second conductive layer has a work function (WF) of at least 4.5, more preferably of at least 4.6.

In the OLED of any of the preceding thirteen paragraphs, the first layer may consist essentially of ITO.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of making an electrode for use in an organic light emitting diode (OLED) device, the method comprising:
   sputter-depositing a first layer comprising indium tin oxide (ITO) on a substrate;
   sputter-depositing a second metallic or substantially metallic layer on the substrate over and directly contacting the first layer comprising ITO to form an electrode structure, so that the first layer comprising ITO is located between at least the substrate and the second metallic or substantially metallic layer, wherein as sputter-deposited the first layer comprising ITO is substantially more oxided than is the second metallic or substantially metallic layer; and
   heat treating the electrode structure including the substrate, the first layer comprising ITO, and the second metallic or substantially metallic layer, at temperature(s) of at least about 300 degrees C. in order to thermally activate the first layer comprising ITO.

2. The method of claim 1, wherein the first layer consists essentially of ITO.

3. The method of claim 1, wherein, as sputter-deposited, the second metallic or substantially metallic layer contains little or no oxygen.

4. The method of claim 1, wherein the substrate comprises glass.

5. The method of claim 1, wherein, as sputter-deposited, the first layer comprising ITO contains at least 15% more oxygen than does the second metallic or substantially metallic layer.

6. The method of claim 1, wherein, as sputter-deposited, the first layer comprising ITO contains at least 20% more oxygen than does the second metallic or substantially metallic layer.

7. The method of claim 1, wherein the first layer comprising ITO is from about 100-200 nm thick.

8. The method of claim 1, wherein the second metallic or substantially metallic layer is from about 0.5 to 50 nm thick.

9. The method of claim 1, wherein the second metallic or substantially metallic layer is from about 1 to 20 nm thick.

10. The method of claim 1, wherein the first layer comprising ITO is thicker than the second metallic or substantially metallic layer, and the second metallic or substantially metallic layer has a work function of at least 4.5.

11. The method of claim 1, wherein the first layer comprising ITO is at least 50 nm thicker than the second metallic or substantially metallic layer.

12. The method of claim 1, wherein said heat treating comprises heat treating the electrode structure including the substrate, the first layer comprising ITO, and the second metallic or substantially metallic layer, at temperature(s) of at least about 400 degrees C.

13. The method of claim 1, wherein said heat treating comprises heat treating the electrode structure including the substrate, the first layer comprising ITO, and the second metallic or substantially metallic layer, at temperature(s) of at least about 500 degrees C.

14. The method of claim 1, wherein said sputter-depositing of the first layer comprising ITO and said sputter-depositing of the second metallic or substantially metallic layer each comprises sputter-depositing at approximately room temperature.

15. The method of claim 1, wherein said first layer comprising ITO is sputter-deposited on the substrate so as to directly contact the substrate.

16. The method of claim 1, wherein said sputter-depositing of the first layer comprising ITO comprises sputtering a ceramic target comprising indium, tin and oxygen; and said sputter-depositing of the second metallic or substantially metallic layer comprises sputtering a metal target.

17. The method of claim 1, wherein after said heat treating the electrode structure has a visible transmission of at least about 80%.

18. The method of claim 1, further comprising, after said heat treating, providing the electrode structure in an OLED device so that an organic light emitting semiconductor layer is located between said electrode structure and another electrode.

19. The method of claim 1, wherein the second metallic or substantially metallic layer comprises one or more of Ni, Pt, and Au.

20. The method of claim 1, wherein the second metallic or substantially metallic layer consists essentially of one or more of Ni, Pt, and Au.

21. The method of claim 1, wherein the second metallic or substantially metallic layer comprises one or more of NiCrMo, NiCrAlFe, NiTi, and NiMo.

22. The method of claim 1, wherein the second metallic or substantially metallic layer consists essentially of one or more of Ni, Pt, Au, NiCr, and NiCrMo.

23. A method of making an organic light emitting diode (OLED) device, the method comprising:
   sputter-depositing a first layer comprising indium tin oxide (ITO) on a glass substrate;
   sputter-depositing a second metallic or substantially metallic layer on the glass substrate over and directly contacting the first layer comprising ITO to form an electrode structure, so that the first layer comprising ITO is located between at least the substrate and the second metallic or substantially metallic layer;
   heat treating the electrode structure including the substrate, the first layer comprising ITO, and the second metallic or substantially metallic layer, at temperature(s) of at least about 400 degrees C. in order to thermally activate the first layer comprising ITO; and
   providing the electrode structure in an OLED device so that an organic light emitting semiconductor layer is located between said electrode structure and another electrode.

* * * * *